United States Patent
Yang et al.

(10) Patent No.: US 10,663,521 B2
(45) Date of Patent: *May 26, 2020

(54) METHOD AND DEVICE FOR ASCERTAINING REQUIRED CHARGING TIME

(71) Applicant: Tencent Technology (Shenzhen) Company Limited, Shenzhen (CN)

(72) Inventors: Lang Yang, Shenzhen (CN); Junming Luo, Shenzhen (CN)

(73) Assignee: TENCENT TECHNOLOGY (SHENZHEN) COMPANY LIMITED, Shenzhen (CN)

(*) Notice: Subject to any disclaimer, the term of this patent is extended or adjusted under 35 U.S.C. 154(b) by 0 days.

This patent is subject to a terminal disclaimer.

(21) Appl. No.: 16/402,563

(22) Filed: May 3, 2019

(65) Prior Publication Data

US 2019/0257887 A1    Aug. 22, 2019

Related U.S. Application Data

(63) Continuation of application No. 14/595,858, filed on Jan. 13, 2015, now Pat. No. 10,324,134, which is a
(Continued)

(30) Foreign Application Priority Data

Jul. 16, 2013 (CN) .......................... 2013 1 0297824

(51) Int. Cl.
*G01R 31/36* (2020.01)
*H02J 7/00* (2006.01)
*H01M 10/42* (2006.01)

(52) U.S. Cl.
CPC ........ *G01R 31/3648* (2013.01); *H02J 7/0021* (2013.01); *H01M 10/4257* (2013.01); *H02J 7/0048* (2020.01)

(58) Field of Classification Search
USPC .......................................................... 702/60
See application file for complete search history.

(56) References Cited

U.S. PATENT DOCUMENTS

| 2001/0023538 | A1 | 9/2001 | Muraguchi et al. |
| 2001/0045813 | A1 | 11/2001 | Suzuki et al. |

(Continued)

FOREIGN PATENT DOCUMENTS

| CN | 1617620 A | 5/2005 |
| CN | 101738585 A | 6/2010 |

(Continued)

OTHER PUBLICATIONS

Office Action dated Dec. 26, 2016 for Chinese Application No. 201310297824.5, 8 pages.
(Continued)

*Primary Examiner* — Paul D Lee
(74) *Attorney, Agent, or Firm* — Brinks Gilson & Lione

(57) ABSTRACT

A method and a device are provided for ascertaining the time required to fully charging a battery of the device. The device ascertains the type of power supply being used when charging the device by ascertaining the time required to fully charge the device based on a historical charging speed and an empirical charging speed corresponding to the power supply's type. Using the method and device provided by the present disclosure can ascertain the required charging time with more accuracy.

20 Claims, 4 Drawing Sheets

Related U.S. Application Data continuation of application No. PCT/CN2014/080932, filed on Jun. 27, 2014.

(56) References Cited

U.S. PATENT DOCUMENTS

| | | | |
|---|---|---|---|
| 2003/0006914 A1 | 1/2003 | Todoriki et al. | |
| 2010/0253290 A1 | 10/2010 | Hammerstrom | |
| 2011/0234150 A1 | 9/2011 | Furukawa et al. | |
| 2013/0116868 A1 | 5/2013 | Erko et al. | |
| 2013/0119920 A1 | 5/2013 | Hsu et al. | |
| 2015/0188324 A1* | 7/2015 | Nicholson | H02J 7/0077 320/107 |

FOREIGN PATENT DOCUMENTS

| | | |
|---|---|---|
| CN | 102438065 A | 5/2012 |
| CN | 102655549 A | 9/2012 |
| CN | 102738871 A | 10/2012 |
| CN | 102833387 A | 12/2012 |
| CN | 103035961 A | 4/2013 |
| CN | 103515664 A | 1/2014 |
| JP | 2012-115116 A | 5/2005 |

OTHER PUBLICATIONS

International Search Report and Written Opinion dated Oct. 17, 2014 for International Application No. PCT/CN2014/080932, 9 pages.

* cited by examiner

METHOD AND DEVICE FOR ASCERTAINING REQUIRED CHARGING TIME

CROSS-REFERENCE TO RELATED APPLICATION(S)

This application is a continuation of U.S. patent application Ser. No. 14/595,858, filed on Jan. 13, 2015, which is a continuation of International Application No. PCT/CN2014/080932, filed on Jun. 27, 2014, which claims priority to Chinese Patent Application No. 201310297824.5, filed on Jul. 16, 2013, all of which are hereby incorporated herein by reference in their entireties.

FIELD

The disclosure relates to the field of intelligent device, especially to a method and a device for ascertaining the time required to fully charge an intelligent device.

BACKGROUND

In the prior art, when an intelligent device is charging via a connected power supply, the time required to fully charge this intelligent device can be calculated based on an empirical charging speed and can be shown to users.

The prior art makes no distinction between different types of power supplies. However, the charging time can vary greatly from power supply to power supply. Therefore, the required charging time obtained by the prior art may have a noticeable deviation, which means a low accuracy.

SUMMARY

The present disclosure provides a method and a device for ascertaining the time required to fully charge a battery with more accuracy.

In order to achieve the above goal, the present disclosure provides solutions described as follows.

In a first aspect, a method for ascertaining the required charging time, comprising ascertaining a type of the power supply being used when charging an intelligent device; ascertaining the time required to fully charge the intelligent device based on an empirical charging speed and a historical charging speed corresponding to the type.

In a second aspect, a device is provided for ascertaining the required charging time. The device includes a hardware processor and a non-transitory storage medium configured to store modules including a first processing module and a second processing module. The first processing module is configured to ascertain the type of the power supply being used when charging an intelligent device and inform a second processing module of the type. The second processing module is configured to ascertain the time required to fully charge the intelligent device based on an empirical charging speed and a historical charging speed corresponding to the type.

The solutions of the present disclosure treat different types of power supplies differently, i.e. it ascertains the required charging time based on the empirical charging speed and historical charging speed corresponding to the type of power supply. Thus, the present disclosure ascertains the time with more accuracy. Moreover, the prior art ascertains the required charging time based on only one parameter i.e. the empirical charging speed, while the present disclosure is based on two parameters, i.e. an empirical charging speed and a historical charging speed, therefore, the present disclosure can further improve the accuracy.

DETAILED DESCRIPTION OF ILLUSTRATED EMBODIMENTS

Reference throughout this specification to "one embodiment," "an embodiment," "example embodiment," or the like in the singular or plural means that one or more particular features, structures, or characteristics described in connection with an embodiment is included in at least one embodiment of the present disclosure. Thus, the appearances of the phrases "in one embodiment" or "in an embodiment," "in an example embodiment," or the like in the singular or plural in various places throughout this specification are not necessarily all referring to the same embodiment. Furthermore, the particular features, structures, or characteristics may be combined in any suitable manner in one or more embodiments.

The terminology used in the description of the disclosure herein is for the purpose of describing particular examples only and is not intended to be limiting of the disclosure. As used in the description of the disclosure and the appended claims, the singular forms "a," "an," and "the" are intended to include the plural forms as well, unless the context clearly indicates otherwise. Also, as used in the description herein and throughout the claims that follow, the meaning of "in" includes "in" and "on" unless the context clearly dictates otherwise. It will also be understood that the term "and/or" as used herein refers to and encompasses any and all possible combinations of one or more of the associated listed items. It will be further understood that the terms "may include," "including," "comprises," and/or "comprising," when used in this specification, specify the presence of stated features, operations, elements, and/or components, but do not preclude the presence or addition of one or more other features, operations, elements, components, and/or groups thereof.

As used herein, the term "module" may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

For a better understanding of the aim, schemes and advantages of the present disclosure, example embodiments thereof are described in detail in connection with the accompanying drawings as follows.

The solutions in the embodiments of the present disclosure are clearly and completely described in the following with reference to the accompanying drawings in the embodiments of the present disclosure.

Figure 1:
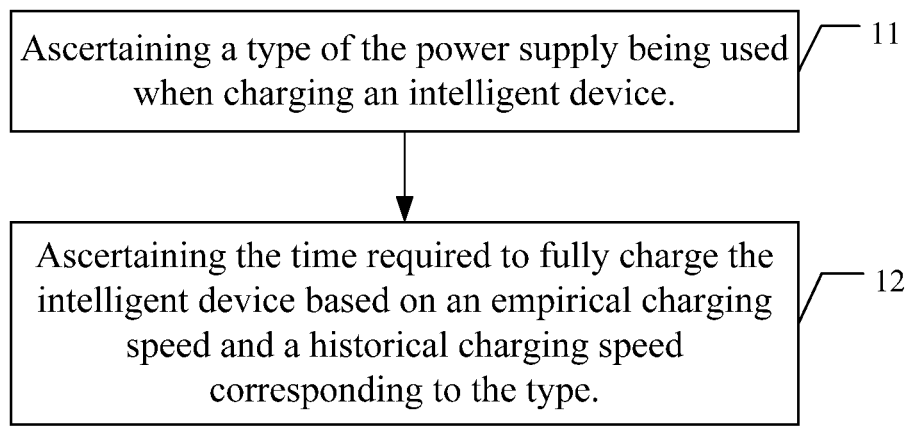
FIG. 1 is a flow chart of the method for ascertaining the required charging time according to an embodiment of the present disclosure.

FIG. 1 is a flow chart of the method for ascertaining the required charging time according to an embodiment of the present disclosure. As shown in FIG. 1, in an embodiment of the present disclosure, the method comprises:

Step 11, ascertaining the type of the power supply being used when charging an intelligent device.

It is prior art that how to ascertain the type of the power supply, for example, the types can be distinguished by the port to with which the charging cable connects.

The type of the power supply includes direct power supply such as original charger, PC USB power supply, mobile power supply, and so on.

Step 12, ascertaining the time required to fully charge the intelligent device based on an empirical charging speed and a historical charging speed corresponding to the type.

For convenience, in the description hereinafter, x is used to represent the type of power supply got from Step 11.

In this step, every unit of electricity to be charged can be treated with following procedure: for type x, obtain separately an empirical time and a historical time required to charge this unit of electricity, and find a weighted average of the empirical time and the historical time, take the weighted average as the estimated time required to charge this unit of electricity; add the estimated time of every unit of electricity up to obtain the time required to fully charge the intelligent device.

The unit of electricity may refers to a small unit of battery capacity in percentage terms, such as 0.5% of a full battery charge, 1% of the full battery charge, 2% of the full battery charge etc. Specified value may be determined according to the actual condition, in the embodiments, the unit of electricity is 1% battery.

Accordingly, in this step, firstly, determine the percentage of remained electricity of the intelligent device, then for each 1% battery that is going to be charged, treat it with the following procedures: based on type x, obtain separately an empirical time and a historical time required to charge this 1% battery, and find a weighted average of the empirical time and the historical time, take the weighted average as the estimated time required to charge this 1% battery; add all the estimated time of every 1% battery up to get the time required to fully charge the intelligent device.

That is, for every 1% battery, calculate the estimated time T according to the following formula:

$T=a*T1+b*T2$; Wherein T1 is the empirical time required to charge this 1% battery, T2 is the historical time required to charge this 1% battery, a and b are weight coefficients, they can be identical, such as $a=b=0.5$, they can also be different, such $a=1/3$, $b=2/3$.

For example, Suppose the percentage of remained electricity is 95% (for convenience, a relatively great value is given here), then for each 1% battery, i.e. which increases the battery from 95% to 96%, from 96% to 97%, from 97% to 98%, from 98% to 99%, from 99% to 100%, determine the estimated time required to charge this 1% battery, which means 5 estimated times in total will be obtained, by adding all these 5 estimated times up we can obtain the time required to fully charge the intelligent device.

Based on the description above, we know that for every 1% battery, an empirical time required to charge this 1% battery and a historical time required to charge this 1% battery are needed to get the estimated time required to charge this 1% battery. How to obtain the empirical time and the historical time will be described in details as below.

1) Empirical Time

For every 1% battery to be charged, the empirical time required to charge this 1% battery can be obtained by means A or means B.

Means A, obtain a default empirical time corresponding to type x, take the default empirical time as the time required to charge this 1% battery.

The default empirical time is set by someone in advance; every type of power supply has a default empirical time. For example, for the type direct power supply, the default empirical time can be set to 1 minute, which means charging 1% battery takes 1 minute, and for the type PC USB power supply, the default empirical time can be set to 2 minutes, which means charging 1% battery takes 2 minutes.

Means b, for each type of power supply, divide 0%~100% into at least two contiguous intervals in advance, and set an empirical time for each interval. In this way, for each 1% battery to be charged, determine in which interval the remained battery power of the intelligent device will fall after charging this 1% battery, then take the empirical time corresponding to this interval as the empirical time required to charge this 1% battery.

However, in practical applications, charging speed varies at different stages, therefore, to ascertain the charging time with more accuracy, dividing the charging range into a plurality intervals is more reasonable, for example, for the type direct power supply, divide the charging range into 2 intervals, such as, 0%~90% and 91%~100%, and set an empirical time for each interval, such as 1 minute for 0%~90% and 1.5 minutes 91%~100%, for the type PC USB power supply, it can also divide the charging range into 2 intervals, 0%~90% and 91%~100%, and set empirical times for both intervals, such as 2 minutes for 0%~90% and 2.5 minutes 91%~100%.

For a 1% battery to be charged, suppose the remained battery will reach 61% after charging this 1% battery, since 61% belongs to 0%~90%, therefore, the empirical time of 0%~90% could be taken as the empirical time required to charge this 1% battery.

In practical applications, choosing means A or means B depends on the actual condition, preferably, choose means B.

2) Historical Time

In practical applications, during charging, every actual time taken to charge 1% battery can be stored as a sample, meanwhile the type of power supply should be stored as well. Similarly, in the embodiment of FIG. 1, during charging, for each charged 1% battery, store separately the actual time taken to charge this 1% battery as a sample corresponding to this 1% battery, and the type of the corresponding power supply, i.e. x.

For example,

Suppose an intelligent device is charging via a direct power supply starting from 0% until 100%, then during charging, for every 1% battery, i.e. 0%~1%, 1%~2%, 2%~3%, . . . , 99%~100%, store separately the actual time taken to charge this 1% battery, and the type of corresponding power supply, i.e. the direct power supply;

Similarly, suppose an intelligent device is charging via a PC USB power supply, starting from 10% until 100%, then during charging, for every 1% battery, i.e. 10%~11%, 11%~12%, 12%~13%, . . . , 99%~100%, store separately the actual time taken to charge this 1% battery, and the type of corresponding power supply, i.e. the PC USB power supply;

Again, suppose an intelligent device is charging via a direct power supply starting from 10% until 90%, then during charging, for every 1% battery, i.e. 10%~11%, 11%~12%, 12%~13%, . . . , 89%~90%, store separately the actual time taken to charge this 1% battery, and the type of corresponding power supply, i.e. the direct power supply;

An increasing number of samples can be stored according to the method described above. More samples, more accurate.

However, too many samples will ask for too much storage. Therefore, in another preferred embodiment of the present application, for each 1% battery, determine first if there are already M stored samples corresponding to this 1% battery and type x, wherein M is a positive integer greater than 1, and could be specified according to actual condition, such as, 20. If not, store the actual time taken to charge this 1% battery as a sample corresponding to this 1% battery; if yes, delete the first one of the stored samples corresponding to this 1% battery and type x, then store the actual time taken to charge this 1% battery as a sample corresponding to this 1% battery. Deleting the first stored sample is mainly because more recent sample reflects the current situation better.

Accordingly, in Step 12, for each 1% battery, the historical time required to charge this 1% battery could be obtained by finding the average of the stored samples corresponding to this 1% battery and type x, and taking the average as the historical time required to charge this 1% battery.

The average can be calculated when it's necessary, or be calculated in advance and updated when adding a new sample, in this way, when necessary, the average can be obtained directly so as to save process time. The present disclosure doesn't impose any restriction on how to calculate the average and how to store a sample.

In addition, in Step 12, after ascertaining the time required to fully charge the intelligent device, it can further comprise showing the time to a user in any appropriate way.

Furthermore, it's possible to show the time only the moment that the intelligent device connect to a power supply, and stop showing since then. It's also possible to keep showing the time to users, and update the time every time 1% battery is charged, i.e. reduce the estimated time of the 1% battery charged just now from the time shown before.

Figure 2:
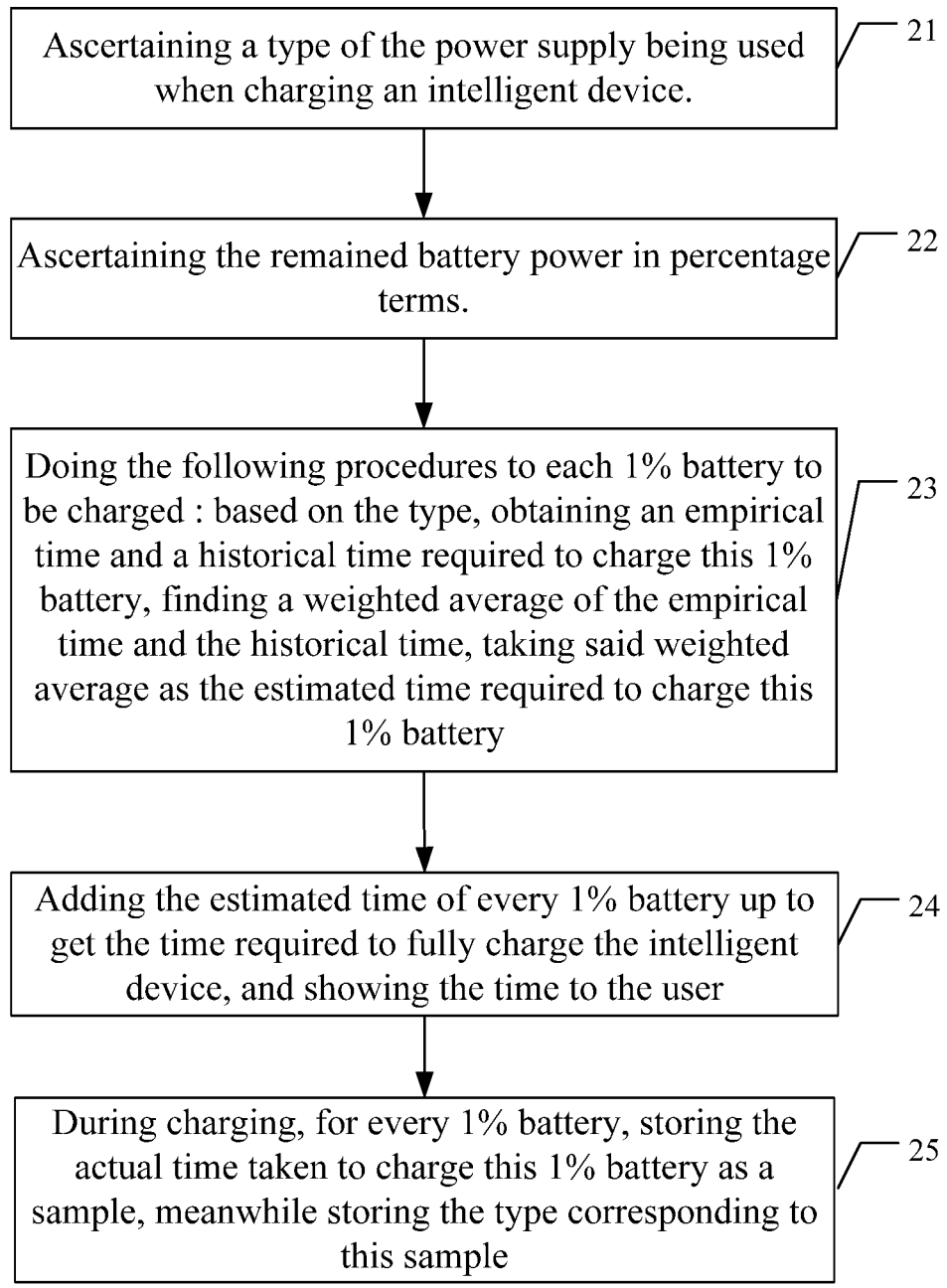
FIG. 2 is a flow chart of the method for ascertaining the required charging time according to a preferred embodiment of the present disclosure.

Based on the above, a preferred embodiment of the method for ascertaining the time required to fully charge a battery is provided as shown in FIG. 2. Similarly, in the preferred embodiment, the unit of electricity is 1% battery. Referring to FIG. 2, the method comprises Step 21, ascertaining the type of the power supply being used when charging an intelligent device.

Step 22, ascertaining the remained battery power in percentage terms.

Step 23, doing the following procedures to each 1% battery to be charged: based on the type, obtaining an empirical time and a historical time required to charge this 1% battery, finding a weighted average of the empirical time and the historical time, taking the weighted average as the estimated time required to charge this 1% battery.

Step 24, adding the estimated time of every 1% battery up to get the time required to fully charge the intelligent device, and showing the time to the user.

Step 25, during charging, for every 1% battery, storing the actual time taken to charge this 1% battery as a sample, meanwhile storing the type corresponding to this sample.

The present disclosure also provides a device for ascertaining the required charging time.

Figure 3:
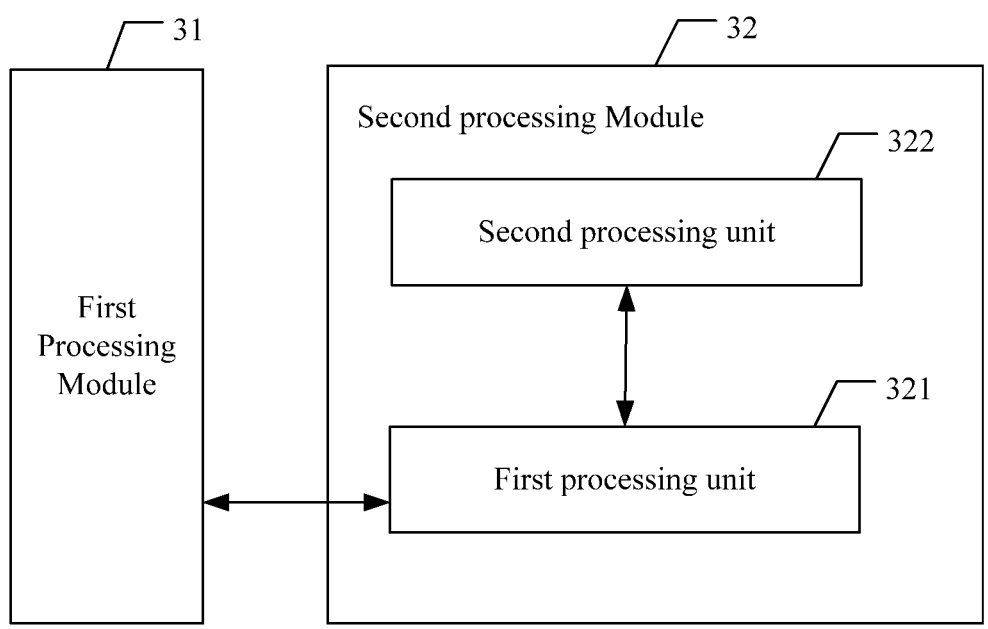
FIG. 3 is a schematic diagram of the structure of the device for ascertaining the required charging time according to an embodiment of the present disclosure.

FIG. 3 is a schematic diagram of the structure of the device for ascertaining the required charging time according to an embodiment of the present disclosure. As shown in FIG. 3, the device comprises a first a processing module 31, configured to ascertain the type of the power supply being used when charging an intelligent device and informing a second processing module 32 of the type; the second processing module 32, configured to ascertain the time required to charge the intelligent device based on an empirical charging speed and a historical charging speed corresponding to the type.

The second processing module 32 comprises a first processing unit 321, configured to perform the following procedures for every unit of electricity to be charged: based on the type, obtaining separately an empirical time and a historical time for charging this unit of electricity, and finding a weighted average of the empirical time and the historical time, taking the weighted average as the estimated time required to charge this unit of electricity; sending the estimated time of every unit of electricity to a second processing unit 322.

The second processing unit 322, configured to add the estimated time of every unit of electricity up to obtain the time required to fully charge the intelligent device.

For example, for each unit of electricity to be charged, the first processing unit 321 obtains a default empirical time corresponding to the type, and takes the default empirical time as the empirical time required to charge this unit of electricity.

Or, for each unit of electricity to be charged, the first processing unit 321 determines the interval that the percentage of remained electricity of the intelligent device should fall in, takes the empirical time corresponding to the interval as the empirical time required to charge this unit of electricity; divides 0%~100% into at least two contiguous intervals in advance based on the type, and sets an empirical time for each interval.

Besides, for each unit of electricity to be charged, the first processing unit 321, finds the average of the samples corresponding to this unit of electricity and the type, and takes the average as the historical time required to charge this unit of electricity.

Accordingly, the first processing unit 321 is also used to store the actual time taken to charge this unit of electricity as a sample corresponding to this unit of electricity, and store the type corresponding to this sample during the process of charging.

Furthermore, the first processing unit 321 is also used to determine if there are already M stored samples corresponding to this unit of electricity and the type, wherein M is a positive integer greater than 1; if not, store the actual time taken to charge this unit of electricity as a sample corresponding to this unit of electricity; if yes, delete the first one of the stored samples corresponding to this unit of electricity, then store the actual time taken to charge this unit of electricity as a sample corresponding to this unit of electricity.

The implementation of the device shown in FIG. 3 can be deduced form the embodiments described above, so it won't be repeated here.

The device shown in FIG. 3 can be arranged in an intelligent device, and can show the time to a user with a screen on an intelligent device, the intelligent device could be a cell phone or a tablet pc, etc.

In brief, when an intelligent device is charging via a power supply, the solution of the present disclosure can treat different types of power supply differently, i.e., for different types of power supplies, the present disclosure ascertains the required charging time based on the empirical time and historical time corresponding to the type of power supply, therefore, compared with prior art which makes no distinction between different types of power supplies, the present ascertains the required charging time with more accuracy. Moreover, the prior art ascertains the required charging time based on only one parameter i.e. the empirical charging speed, while the present disclosure is based on two parameters, i.e. the empirical charging speed and the historical charging speed, thereby, the present disclosure can further improve the accuracy. Furthermore, the present disclosure is easy to implement and easy to be accepted.

Figure 4:
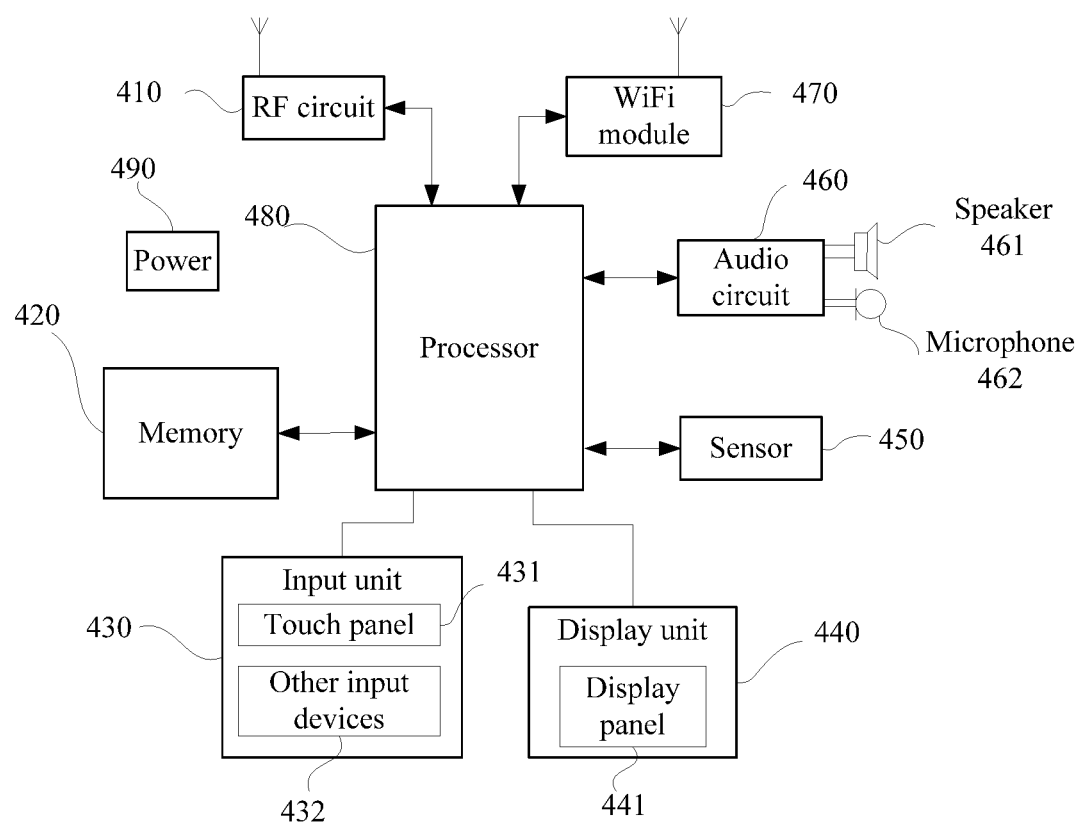
FIG. 4 is a block diagram of the device according to embodiments of the present disclosure.

FIG. 4 provides an example device according to embodiments of the disclosure. To simplify the expatiation, only some relevant portions associated with the present embodiment are illustrated, other details un-displayed can be reviewed in the method described above. For example, the device may be any terminal device such as a mobile phone, a Tablet PC, a PDA (Personal Digital Assistant), a POS (Point of Sales), a car PC, or any computing device having a processor.

In FIG. 4, the device includes a radio frequency (RF) circuit 410, a memory 420, an input unit 430, a display unit 440, a sensor 450, an audio circuit 460, a wireless fidelity (WiFi) module 470, a processor 480, and a power 490, etc. It's understood for persons skilled in the art that, the structure of the device illustrated in FIG. 4 is not limited, some components may be added or omitted, or some combinations or arrangement may be included.

Following is a detailed description of the structure of the device in FIG. 4. The RF circuit 410 is configured to receive and sending signals during calling or process of receiving and sending message. For example, the RF circuit 410 may receive downlink information from the base station and send it to the processor 480; or send uplink data to the base station. Generally, the RF circuit 410 includes, but is not limited to, an antenna, at least one amplifier, a transceiver, a coupler, a low noise amplifier (LNA), a diplexer, and the like. In addition, the RF circuit 40 can communicate with network or other devices by wireless communication. Such wireless communication can use any one communication standard or protocol, which includes, but is not limited to, Global System of Mobile communication (GSM), (General Packet Radio Service, GPRS), (Code Division Multiple Access, CDMA), (Wideband Code Division Multiple Access, WCDMA), (Long Term Evolution, LTE), email, or (Short Messaging Service, SMS).

The memory 420 is configured to store software program and module which may be implemented by the processor 480, so as to perform multiple functional applications of a device and data processing. The memory 430 mainly includes storing program area and storing data area. Concretely, the storing program area can store the operating system, at least one application program with required function (such as sound playing function, image playing function, etc.). The storing data area can store data established by the device according to actual using demand (such as audio data, phonebook, etc.) Furthermore, the memory 420 can be high-speed random access memory, or nonvolatile memory, such as disk storage, flash memory device, or other volatile solid-state memory storage devices.

The input unit 430 is configured to receive the entered number or character information, and the entered key signal related to user setting and function control of the device. Concretely, the input unit 430 includes a touch panel 431 or other input devices 432. The touch panel 431 is called as touch screen, which can collect user's touch operations thereon or nearby (for example the operations generated by fingers of user or stylus pen, and the like, touching on the touch panel 431 or touching near the touch panel 431), and drive the corresponding connection device according to the preset program. Optionally, the touch panel 431 includes two portions including a touch detection device and a touch controller. For example the touch detection device is configured to detect touch position of the user and detecting signals accordingly, and then sending the signals to the touch controller. Subsequently, the touch controller receives touch information from the touch detection device, and converts it to contact coordinates which are to be sent to the processor 480, and then receives command sent by the processor 480 to perform. In addition, besides the touch panel 431, the input unit 430 can include, but is not limited to, other input devices 432, such as one or more selected from physical keyboard, function keys (such as volume control keys, switch key-press, etc.), a trackball, a mouse, and an operating lever, etc.

The display unit 440 is configured to display information entered by the user or information supplied to the user, and menus of the device. For example, the display unit 440 includes a display panel 441, such as a Liquid Crystal Display (LCD), or an Organic Light-Emitting Diode (OLED). Furthermore, the display panel 441 can be covered by the touch panel 431, after touch operations are detected on or near the touch panel 431, they will be sent to the processor 480 to determine the type of the touching event. Subsequently, the processor 480 supplies the corresponding visual output to the display panel 441 according to the type of the touching event. As shown in FIG. 4, the touch panel 431 and the display panel 441 are two individual components to implement input and output of the device, but they can be integrated together to implement the input and output in some embodiments.

Furthermore, the device includes at least one sensor 450, such as light sensors, motion sensors, or other sensors. For example the light sensors includes ambient light sensors for adjusting brightness of the display panel 441 according to the ambient light, and proximity sensors for turning off the display panel 441 and/or maintaining backlight when the device is moved to the ear side. Accelerometer sensor as one of the motion sensors can detect the magnitude of accelerations in every direction (Triaxial, generally), and detect the magnitude and direction of gravity in an immobile status, which is applicable to applications of identifying attitudes of the mobile (such as switching between horizontal and vertical screens, related games, magnetometer attitude calibration, etc.), vibration recognition related functions (such as pedometer, percussion, etc.). And the device also can configure other sensors (such as gyroscopes, barometers, hygrometers, thermometers, infrared sensors, etc.) whose detailed descriptions are omitted here.

The audio circuit 460, the speaker 461 and the microphone 462 supply an audio interface between the user and the device. For example the audio data is received and converted to electrical signals by audio circuit 460, and then transmitted to the speaker 461, which are converted to sound signal to output. On the other hand, the sound signal collected by the speaker is then converted to electrical signals which will be received and converted to audio data. Subsequently, the audio data are output to the processor 480 to process, and then sent to another device via the RF circuit 410, or sent to the memory 420 to process further.

WiFi pertains to short-range wireless transmission technology providing a wireless broadband Internet, by which the device can help the user to receive and send email, browse web, and access streaming media, etc. Although the WiFi module 470 is illustrated in FIG. 4, it should be understood that, WiFi module 470 is not a necessary for the device, which can be omitted according the actual demand without changing the essence of the present disclosure.

The processor 480 is a control center of the device, which connects with every part of the device by various interfaces or circuits, and performs various functions and processes data by running or performing software program/module stored in the memory 420 or calling data stored in the memory 420, so as to monitor the device. Optionally, the processor 480 may include one or more processing units. Preferably, the processor 480 can integrate with application processors and modem processors, for example, the application processors include processing operating system, user interface and applications, etc.; the modern processors are configured to implement wireless communications. It can be understood that, it's an option to integrate the modern processors to the processor 480.

Furthermore, the device may include a power supply (such as battery) supplying power for each component, preferably, the power supply connects with the processor 480 via a power management system, which may be configured to manage charging, discharging, and power consuming.

In addition, the device may include a camera, and a Bluetooth module, etc., which are not illustrated. In this embodiment, the processor 480 in the device is configured to implement the above disclosed method in FIGS. 1 and 2.

The foregoing descriptions are merely example embodiments of the disclosure, but are not intended to limit the protection scope of the present disclosure. Any variation or replacement readily figured out by persons skilled in the art within the technical scope disclosed in the present disclosure shall all fall within the protection scope of the present disclosure. Thus, the protection scope of the present disclosure shall be subject to the protection scope of the claims.

What is claimed is:

1. An apparatus for determining a charging time of a battery, the apparatus comprising:
   a non-transitory storage medium configured to store instructions; and
   processing circuitry in communication with the non-transitory storage medium, and configured to execute the instructions stored on the non-transitory storage medium to:
   detect a type of power supply used to charge the battery;
   determine, for the type of power supply, a historical charging speed for charging a predetermined unit of electricity in the battery;
   determine, for the type of power supply, an empirical charging speed for charging the predetermined unit of electricity in the battery;
   determine, for the type of power supply, an empirical time to charge the unit of electricity based on the empirical charging speed;
   determine, for the type of power supply, a historical time to charge the unit of electricity based on the historical charging speed;
   obtain an estimated time to charge the unit of electricity based on a weighted average of the empirical time and the historical time;
   sum the weighted average of the empirical time and the historical time to determine a time to fully charge the battery; and
   control charging of the battery according to the determined time to fully charge the battery.

2. The apparatus of claim 1, wherein for each unit of electricity to be charged, the processing circuitry is configured to obtain a default empirical time corresponding to the type of power supply, and assign the default empirical time as the empirical time to charge the unit of electricity.

3. The apparatus of claim 1, wherein for each unit of electricity to be charged, the processing circuitry is configured to:
   determine an interval in which a percentage of remaining electricity of the battery should fall;
   assign the empirical time corresponding to the interval as the empirical time to charge the unit of electricity;
   partition the interval between 0%~100% into a plurality of contiguous intervals in advance based on the type of power supply; and
   set a respective empirical time for each interval.

4. The apparatus of claim 1, wherein for each unit of electricity to be charged, the processing circuitry is configured to:
   determine an average of samples corresponding to the unit of electricity and the type of power supply;
   assign the average as the historical time to charge the unit of electricity;
   store an actual time taken to charge the unit of electricity as a sample corresponding to the unit of electricity; and
   store the type of power supply corresponding to the sample during the process of charging.

5. The apparatus of claim 4, wherein the processing circuitry is further configured to:
   determine there are existing stored samples corresponding to the unit of electricity and the type of power supply;
   delete a first one of the stored samples; and
   replace the deleted first one of the stored samples with the actual time taken to charge the unit of electricity.

6. The apparatus of claim 4, wherein the processing circuitry is further configured to:
   determine a lack of stored samples corresponding to the unit of electricity and the type of power supply; and
   store the actual time taken to charge the unit of electricity as a sample corresponding to the unit of electricity and the type of power supply.

7. The apparatus of claim 1, wherein the processing circuitry comprises:
   a first processing module configured to detect the type of power supply used to charge the battery; and
   a second processing module configured to control charging of the battery.

8. A method for determining a charging time of a battery, the method comprising:
   detecting a type of power supply used to charge the battery using processing circuitry;
   determining, for the type of power supply, a historical charging speed for charging a predetermined unit of electricity in the battery;
   determining, for the type of power supply, an empirical charging speed for charging the predetermined unit of electricity in the battery;
   determining, for the type of power supply, an empirical time to charge the unit of electricity based on the empirical charging speed;

determining, for the type of power supply, a historical time to charge the unit of electricity based on the historical charging speed;

obtaining an estimated time to charge the unit of electricity based on a weighted average of the empirical time and the historical time;

summing the weighted average of the empirical time and the historical time to determine a time to fully charge the battery; and controlling charging of the battery according to the determined time to fully charge the battery using the processing circuitry.

9. The method of claim 8, wherein for each unit of electricity to be charged, the method further comprises:

obtaining a default empirical time corresponding to the type of power supply; and assigning the default empirical time as the empirical time to charge the unit of electricity.

10. The method of claim 8, wherein for each unit of electricity to be charged, the method further comprises:

determining an interval in which a percentage of remaining electricity of the battery should fall;

assigning the empirical time corresponding to the interval as the empirical time to charge the unit of electricity;

partitioning the interval between 0%~100% into a plurality of contiguous intervals in advance based on the type of power supply; and setting a respective empirical time for each interval.

11. The method of claim 8, wherein for each unit of electricity to be charged, the method further comprises:

determining an average of samples corresponding to the unit of electricity and the type of power supply;

assigning the average as the historical time to charge the unit of electricity;

storing an actual time taken to charge the unit of electricity as a sample corresponding to the unit of electricity; and storing the type of power supply corresponding to the sample during the process of charging.

12. The method of claim 8, further comprising:

determining there are existing stored samples corresponding to the unit of electricity and the type of power supply;

deleting a first one of the stored samples; and replacing the deleted first one of the stored samples with the actual time taken to charge the unit of electricity.

13. The method of claim 8, further comprising:

determining a lack of stored samples corresponding to the unit of electricity and the type of power supply; and storing the actual time taken to charge the unit of electricity as a sample corresponding to the unit of electricity and the type of power supply.

14. An apparatus for determining a charging time of a battery, the apparatus comprising:

a non-transitory storage medium configured to store instructions; and processing circuitry in communication with the non-transitory storage medium, and configured to execute the instructions stored on the non-transitory storage medium to:

detect a type of power supply used to charge the battery;

obtain, for the type of power supply, an estimated time to charge a unit of electricity in the battery based on a weighted average of an empirical time to charge the unit of electricity and a historical time to charge the unit of electricity;

sum the weighted average of the empirical time and the historical time;

determine a time to fully charge the battery based on the sum of the weighted average of the empirical time and the historical time; and control charging of the battery according to the determined time to fully charge the battery.

15. The apparatus of claim 14, wherein for each unit of electricity to be charged, the processing circuitry is configured to obtain a default empirical time corresponding to the type of power supply, and assign the default empirical time as the empirical time to charge the unit of electricity.

16. The apparatus of claim 14, wherein for each unit of electricity to be charged, the processing circuitry is configured to:

determine an interval in which a percentage of remaining electricity of the battery should fall;

assign the empirical time corresponding to the interval as the empirical time to charge the unit of electricity;

partition the interval between 0%~100% into a plurality of contiguous intervals in advance based on the type of power supply; and set a respective empirical time for each interval.

17. The apparatus of claim 14, wherein for each unit of electricity to be charged, the processing circuitry is configured to:

determine an average of samples corresponding to the unit of electricity and the type of power supply;

assign the average as the historical time to charge the unit of electricity;

store an actual time taken to charge the unit of electricity as a sample corresponding to the unit of electricity; and store the type of power supply corresponding to the sample during the process of charging.

18. The apparatus of claim 17, wherein the processing circuitry is further configured to:

determine there are existing stored samples corresponding to the unit of electricity and the type of power supply;

delete a first one of the stored samples; and replace the deleted first one of the stored samples with the actual time taken to charge the unit of electricity.

19. The apparatus of claim 17, wherein the processing circuitry is further configured to:

determine a lack of stored samples corresponding to the unit of electricity and the type of power supply; and store the actual time taken to charge the unit of electricity as a sample corresponding to the unit of electricity and the type of power supply.

20. The apparatus of claim 14, wherein the processing circuitry comprises:

a first processing module configured to detect the type of power supply used to charge the battery; and a second processing module configured to control charging of the battery.

* * * * *